(12) United States Patent
Kessenich et al.

(10) Patent No.: US 9,761,322 B2
(45) Date of Patent: *Sep. 12, 2017

(54) PROGRAM OPERATIONS WITH EMBEDDED LEAK CHECKS

(71) Applicant: MICRON TECHNOLOGY, INC., Boise, ID (US)

(72) Inventors: Jeffery A. Kessenich, Vancouver, WA (US); Joemar Sinipete, Boise, ID (US); Chiming Chu, Boise, ID (US); Jason L. Nevill, Boise, ID (US); Kenneth W. Marr, Boise, ID (US); Renato C. Padilla, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/019,397

(22) Filed: Feb. 9, 2016

(65) Prior Publication Data

US 2016/0155513 A1  Jun. 2, 2016

Related U.S. Application Data

(63) Continuation of application No. 14/302,782, filed on Jun. 12, 2014, now Pat. No. 9,281,078.

(51) Int. Cl.
| | |
|---|---|
| *G11C 16/00* | (2006.01) |
| *G11C 16/34* | (2006.01) |
| *G11C 16/10* | (2006.01) |
| *G11C 16/26* | (2006.01) |
| *G11C 29/04* | (2006.01) |

(Continued)

(52) U.S. Cl.
CPC ......... *G11C 16/3459* (2013.01); *G01R 31/02* (2013.01); *G11C 7/00* (2013.01); *G11C 7/02* (2013.01); *G11C 8/08* (2013.01); *G11C 16/10* (2013.01); *G11C 16/26* (2013.01); *G11C 29/02* (2013.01); *G11C 29/025* (2013.01); *G11C 29/04* (2013.01); *G11C 29/50008* (2013.01); *G11C 16/00* (2013.01); *G11C 16/349* (2013.01);

(Continued)

(58) Field of Classification Search
CPC .... G11C 8/08; G11C 7/00; G11C 7/02; G11C 29/025; G11C 2029/5006; G11C 29/50008; G11C 2029/1202; G11C 29/02
USPC ................. 365/185.19, 189.07, 201
See application file for complete search history.

(56) References Cited

U.S. PATENT DOCUMENTS

| | | |
|---|---|---|
| 5,117,426 A | 5/1992 | McAdams |
| 5,548,557 A | 8/1996 | Futatsuya et al. |

(Continued)

*Primary Examiner* — Hoai V Ho
*Assistant Examiner* — Roberto Mancera, Jr.
(74) *Attorney, Agent, or Firm* — Dicke, Billig & Czaja, PLLC

(57) ABSTRACT

Methods of operating a memory device having embedded leak checks may mitigate data loss events due to access line defects, and may facilitate improved power consumption characteristics. Such methods might include applying a program pulse to a selected access line coupled to a memory cell selected for programming, verifying whether the selected memory cell has reached a desired data state, bringing the selected access line to a first voltage, applying a second voltage to an unselected access line, applying a reference current to the selected access line, and determining if a current flow between the selected access line and the unselected access line is greater than the reference current.

20 Claims, 13 Drawing Sheets

(51) Int. Cl.
*G01R 31/02* (2006.01)
*G11C 29/02* (2006.01)
*G11C 8/08* (2006.01)
*G11C 7/00* (2006.01)
*G11C 29/50* (2006.01)
*G11C 7/02* (2006.01)
*G11C 29/12* (2006.01)

(52) U.S. Cl.
CPC ............. *G11C 2029/1202* (2013.01); *G11C 2029/1204* (2013.01); *G11C 2029/5006* (2013.01)

(56) References Cited

U.S. PATENT DOCUMENTS

| | | | |
|---|---|---|---|
| 6,198,662 B1 | 3/2001 | Chen et al. | |
| 6,242,936 B1 | 6/2001 | Ho et al. | |
| 6,307,778 B1 | 10/2001 | Micheloni et al. | |
| 6,353,556 B2 | 3/2002 | Chen et al. | |
| 6,781,902 B2 | 8/2004 | Oumiya et al. | |
| 6,975,538 B2 | 12/2005 | Abedifard et al. | |
| 7,180,781 B2 | 2/2007 | Abedifard et al. | |
| 7,283,398 B1 | 10/2007 | He et al. | |
| 7,532,513 B2 | 5/2009 | Chen et al. | |
| 7,554,852 B2 | 6/2009 | Wooldridge | |
| 7,835,178 B2* | 11/2010 | Chen ................... | G11C 8/08 365/185.02 |
| 7,859,910 B2* | 12/2010 | Shiga .................. | G11C 8/08 365/185.24 |
| 8,018,771 B2* | 9/2011 | Maccarrone ....... | G11C 16/0483 365/185.17 |
| 8,051,240 B2* | 11/2011 | Dutta .................. | B05B 11/3098 711/103 |
| 8,379,454 B2* | 2/2013 | Kochar .............. | G11C 16/3459 365/185.19 |
| 8,432,732 B2 | 4/2013 | Li et al. | |
| 8,514,630 B2 | 8/2013 | Huynh et al. | |
| 8,588,007 B2* | 11/2013 | Yamada .............. | G11C 29/025 365/189.07 |
| 8,634,264 B2 | 1/2014 | Yamada | |
| 8,947,946 B2 | 2/2015 | Yamada | |
| 9,159,452 B2* | 10/2015 | Yamada .............. | G11C 29/02 |
| 2001/0040836 A1 | 11/2001 | Mori et al. | |
| 2003/0067809 A1 | 4/2003 | Wooldridge | |
| 2006/0239111 A1 | 10/2006 | Shingo | |
| 2007/0019480 A1 | 1/2007 | Conner et al. | |
| 2009/0063918 A1 | 3/2009 | Chen et al. | |
| 2009/0316487 A1 | 12/2009 | Lee et al. | |
| 2010/0125429 A1 | 5/2010 | Yamada | |
| 2011/0194360 A1 | 8/2011 | Yamada | |
| 2012/0008384 A1 | 1/2012 | Li et al. | |
| 2012/0218833 A1 | 8/2012 | Yamada | |
| 2012/0281479 A1 | 11/2012 | Kochar et al. | |
| 2012/0294093 A1 | 11/2012 | Yang | |
| 2012/0327710 A1 | 12/2012 | He et al. | |
| 2013/0194868 A1 | 8/2013 | Hashimoto | |
| 2014/0050003 A1 | 2/2014 | Tomotani et al. | |
| 2014/0211553 A1 | 7/2014 | Lai | |

* cited by examiner

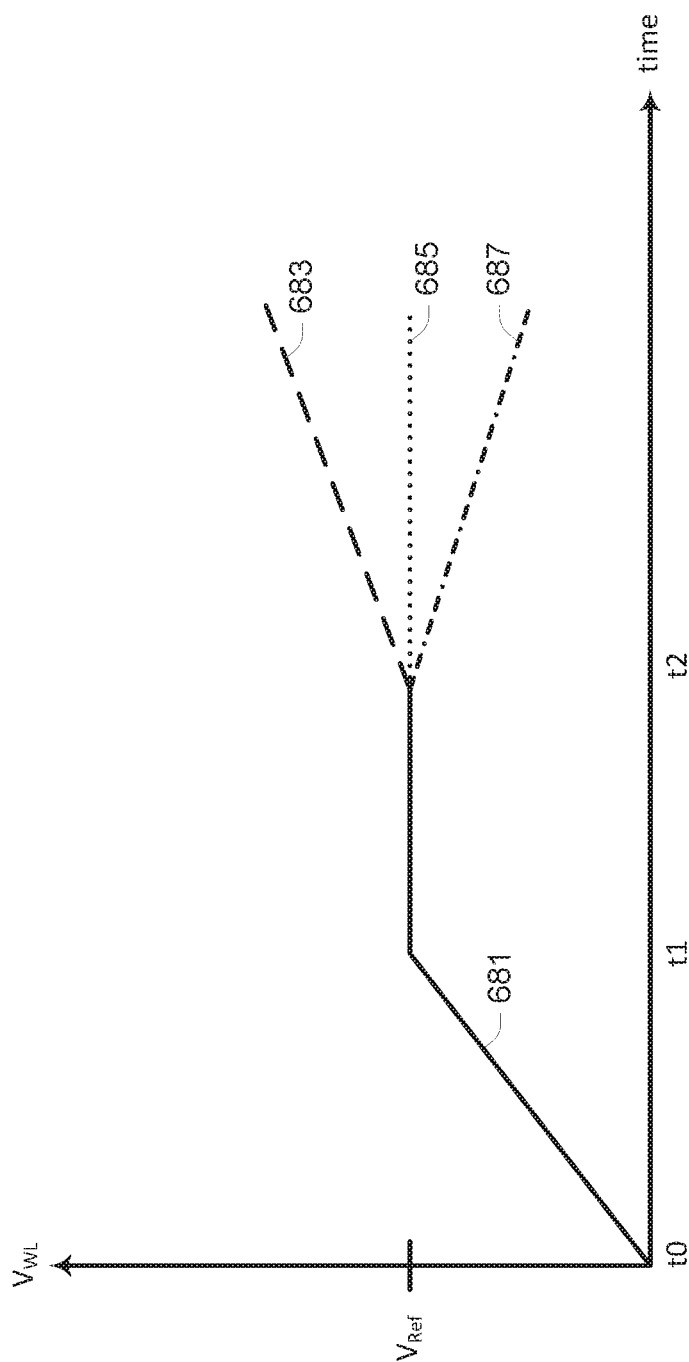

__US 9,761,322 B2__

PROGRAM OPERATIONS WITH EMBEDDED LEAK CHECKS

RELATED APPLICATIONS

This application is a continuation of U.S. patent application Ser. No. 14/302,782, filed Jun. 12, 2014, entitled "PROGRAM OPERATIONS WITH EMBEDDED LEAK CHECKS," now U.S. Pat. No. 9,281,078 issued on Mar. 8, 2016, which is commonly assigned and incorporated herein by reference in its entirety.

TECHNICAL FIELD

The present disclosure relates generally to memory and, in particular, in one or more embodiments, the present disclosure relates to memory program operations with embedded leak checks.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

Power consumption is often an important consideration in the design and usage of memory devices. While many operations of a memory device consume relatively large amounts of power, these operations can be come much larger consumers of power if faults in the memory device, such as electrical shorts, lead to unintended current paths. Not only can such faults lead to increased power consumption for an individual operation, they can further hinder successful completion of that operation, which can lead to wasted additional iterations of the operation seeking a successful completion that might be unobtainable. Such additional iterations further exacerbate the power consumption issues. In addition, such faults may lead to data loss through false indication of threshold voltages.

For the reasons stated above, and for other reasons stated below which will become apparent to those skilled in the art upon reading and understanding the present specification, there is a need in the art for alternative methods of operating memory, and apparatus to perform such methods.

BRIEF DESCRIPTION OF THE DRAWINGS

FIG. 6C is a voltage trace of a voltage level of a selected access line for various conditions during a leak check according to various embodiments.

DETAILED DESCRIPTION

Figure 1:
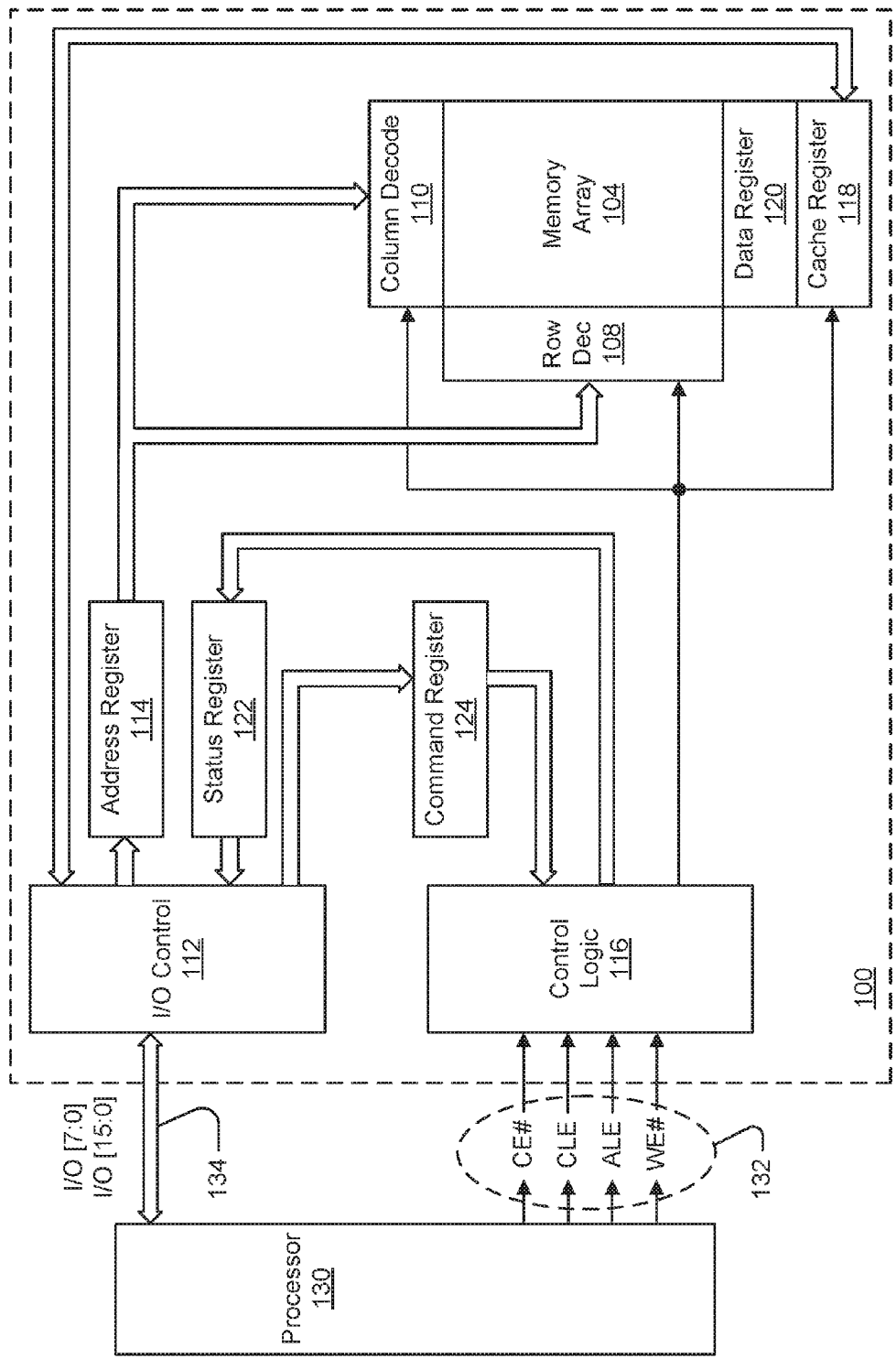
FIG. 1 is a simplified block diagram of a memory device in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Memory device access operations, e.g., program operations (sometimes referred to as write operations), are often large consumers of current, and thus power, for the memory device. Sometimes, faults occur in a memory array, such as electrical shorts between access lines, that can increase the power demands of a program operation due to the extraneous current flow through the short. In addition, during a program operation, it is common to use successively larger voltages on access lines coupled to memory cells selected for programming until each of the memory cells selected for programming has either reached its desired data state, or the program operation is deemed to have failed because some limit on the number of applied programming pulses has been reached before all of the selected memory cells have been programmed. Where an access line is shorted, such successively larger voltages exacerbate the extraneous current loss, and can also lead to undesirable program disturb of nearby memory cells, such as memory cells coupled to the access line that are either not selected for programming, or have already reached their desired data state. As such, it may be desirable to know whether an access line is shorted before completing (or failing) the program operation.

In addition, a shorted access line may lead to read errors in that a memory cell selected for reading may not be receiving the intended voltage (e.g., a read voltage) at its control gate, and thus may not activate even if its threshold voltage is less than the intended voltage. As such, it may further be desirable to know whether an access line is shorted even if a program operation was deemed to be successful.

Various embodiments described herein incorporate a leak check embedded within a program operation. A leak check may be performed after some number of programming pulses. A leak check may further be performed upon successful verification that all memory cells selected for programming during the program operation have reached their desired data state.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations, such as program operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
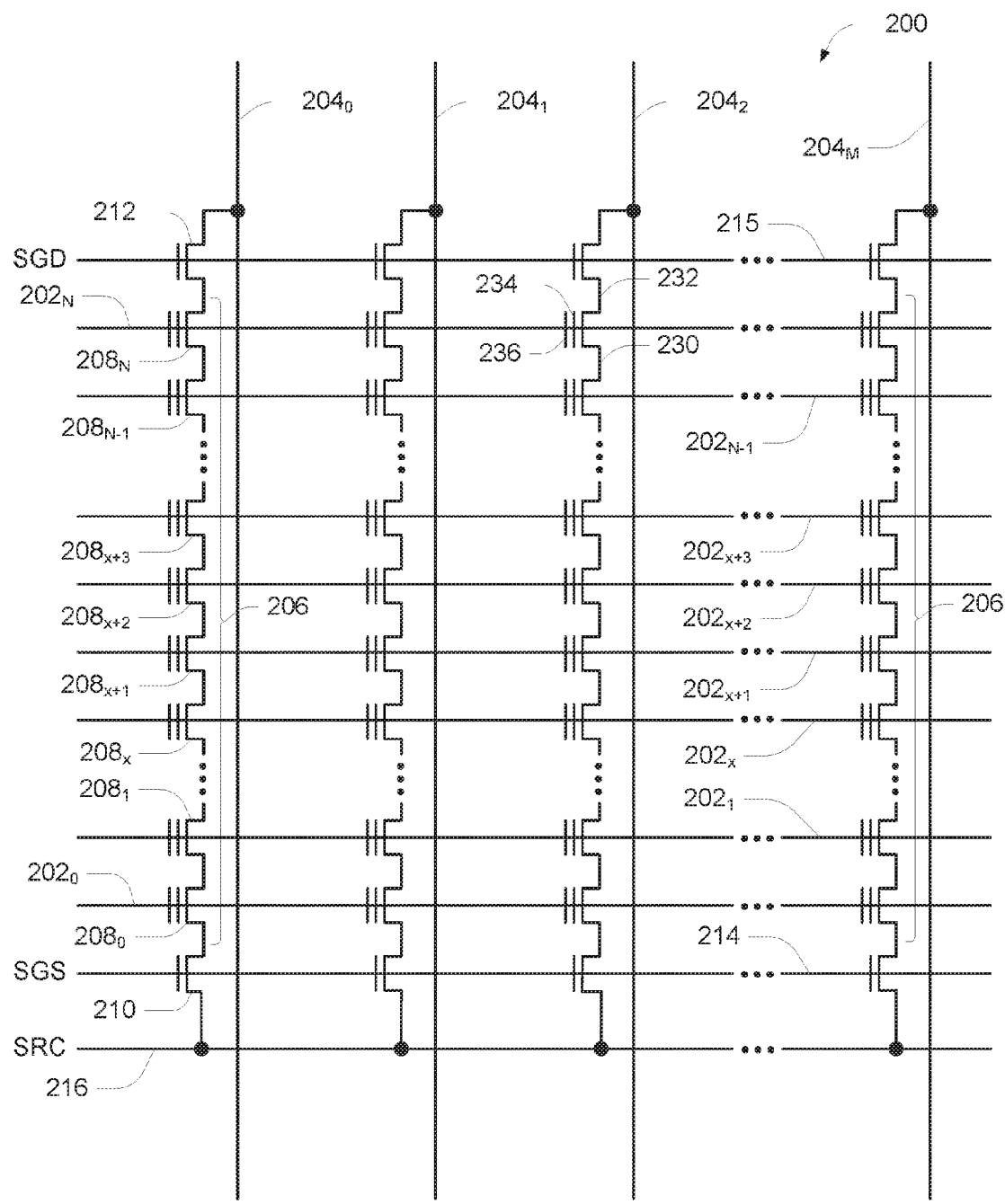
FIG. 2 is a schematic of a portion of an array of memory cells as could be used in a memory device of the type described with reference to FIG. 1.

FIG. 2 is a schematic of an array of memory cells 200, e.g., as a portion of the array of memory cells 104, in accordance with an embodiment. Array of memory cells 200 includes access lines, such as word lines $202_0$ to $202_N$, and intersecting data lines, such as bit lines $204_0$ to $204_M$. For ease of addressing in the digital environment, the number of word lines 202 and the number of bit lines 204 are generally each some power of two, e.g., 256 word lines 202 by 4,096 bit lines 204.

Array of memory cells 200 is arranged in rows (each corresponding to a word line 202) and columns (each corresponding to a bit line 204). Each column may include a string of serially-connected memory cells 208, such as one of the NAND strings 206. Each NAND string 206 may be coupled to a common source (SRC) 216 and includes memory cells $208_0$ to $208_N$. The memory cells 208, depicted as floating-gate transistors in FIG. 2, represent non-volatile memory cells for storage of data. The memory cells 208 of each NAND string 206 are connected in series, e.g., source to drain, between a source select line (SGS) 214 and a drain select line (SGD) 215.

A source select gate 210, e.g., a field-effect transistor (FET), is located at each intersection between a NAND string 206 and a source select line 214, and a drain select gate 212, e.g., a field-effect transistor (FET), is located at each intersection between a NAND string 206 and a drain select line 215. In this way, the memory cells 208 of each NAND string 206 are connected between a source select gate 210 and a drain select gate 212. Arrays of memory cells utilizing more than one select gate at one or both ends of a NAND string 206 are known. If multiple source select gates 210 are utilized for a given string of memory cells 206, they could be coupled in series between the common source 216 and the memory cell $208_0$ of that string of memory cells 206. If multiple drain select gates 212 are utilized for a given string of memory cells 206, they could be coupled in series between the corresponding bit line 204 and the memory cell $208_N$ of that string of memory cells 206.

A source of each source select gate 210 is connected to common source 216. The drain of each source select gate 210 is connected to a memory cell 208 of a corresponding NAND string 206. Therefore, each source select gate 210 selectively couples its corresponding NAND string 206 to a common source 216. A control gate of each source select gate 210 is connected to source select line 214.

The drain of each drain select gate 212 is connected to the bit line 204 for the corresponding NAND string 206. The source of each drain select gate 212 is connected to the last memory cell $208_N$ of its corresponding NAND string 206. Therefore, each drain select gate 212 selectively couples a corresponding NAND string 206 to a corresponding bit line 204. A control gate of each drain select gate 212 is connected to drain select line 215.

Typical construction of memory cells 208 includes a data-storage structure 234 (e.g., a floating gate, charge trap, etc.) that can determines a data value of the cell (e.g., through changes in threshold voltage), and a control gate 236, as shown in FIG. 2. Memory cells 208 have their control gates 236 coupled to (and in some cases form) a word line 202. A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 3A:
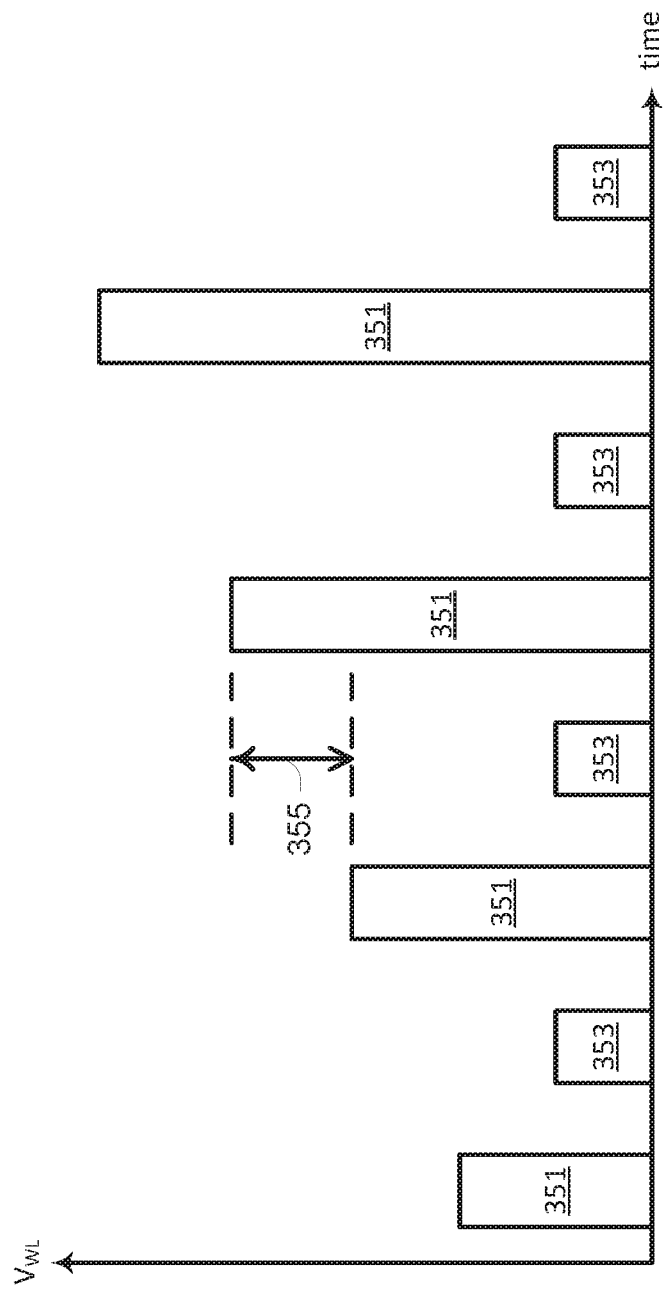
FIG. 3A shows a plot of an access line voltage versus time of a typical prior art program operation.

FIG. 3A shows a plot of an access line voltage $V_{WL}$ versus time of a typical prior art program operation. The figure shows a series of incrementally increasing programming pulses 351 that might be applied to an access line (e.g., selected access line) coupled to a control gate of a memory cell selected for programming. The programming pulses 351 might increase a charge level on a floating gate of the selected memory cell, thereby increasing the cell's threshold voltage Vt. Each subsequent programming pulse 351 might be higher than a previous programming pulse 351 by some step voltage 355.

After each programming pulse 351, a verify pulse 353 might be applied to the access line to determine if the selected memory cell's threshold voltage has increased to some level representative of a desired data state, e.g., a threshold voltage higher than or equal to a voltage level of the verify pulse 353. The determination that the selected memory cell's threshold voltage has increased to a level representative of the desired data state might be indicated by restricted current flow (e.g., no current flow) through the selected memory cell when the verify pulse 353 fails to activate the selected memory cell. This determination might involve sensing current flow of the string of memory cells containing the selected memory cell either directly, e.g., comparing a level of current flow to some reference current source, or indirectly, e.g., allowing the current flow to generate a voltage on a data line of the string of memory cells, and, after some time period, comparing the generated voltage to a some reference voltage. Other means of sensing current flow are also known.

A selected access line is often coupled to more than one memory cell selected for programming. As such, each selected memory cell might be sensed during each verify pulse 353 to determine if they have reached their respective desired data states. Following each verification, those memory cells that have reached their respective desired data states (e.g., threshold voltage has increased to a level representative of the desired data state) might be inhibited from further programming.

All selected memory cells may not reach their desired data states at the same time. In addition, an access line selected for a program operation often is coupled to memory cells that were not selected for programming during the program operation. As such, the selected access line will typically be coupled to both memory cells selected for programming and memory cells for which no programming (e.g., no further programming) is desired. Memory cells that are either not selected for programming during the program operation, or have already reached their desired data state might be inhibited from programming, e.g., by application of a voltage to their respective data lines selected to inhibit programming of memory cells receiving programming pulses 351.

Figure 3B:
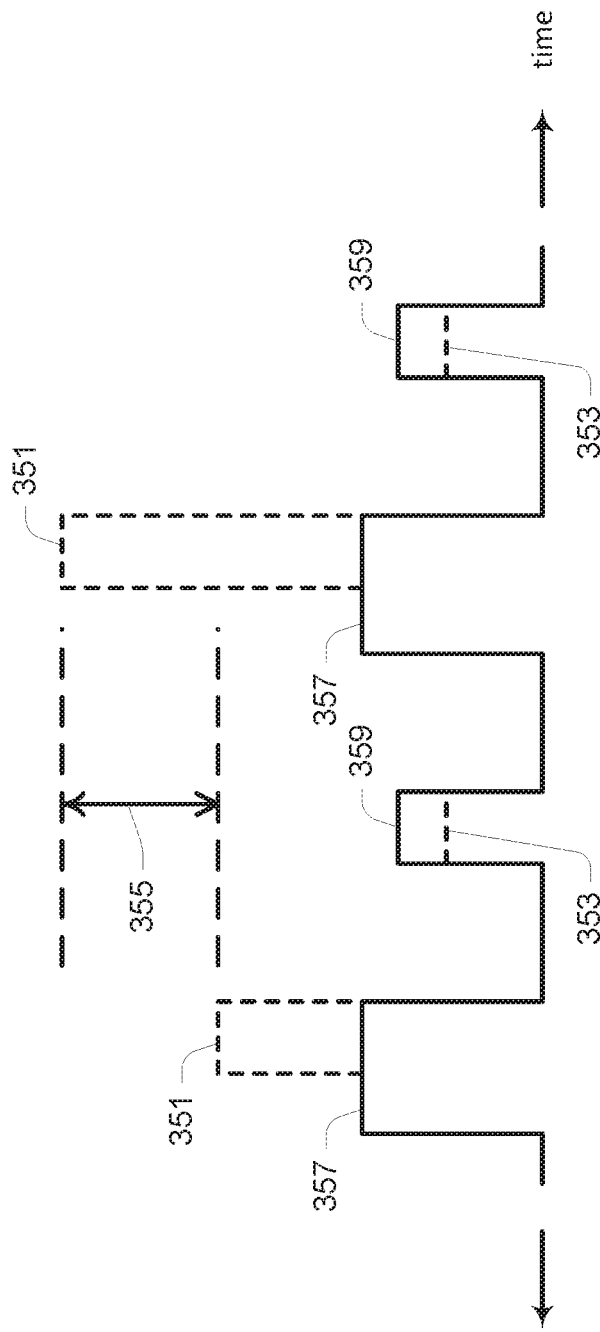
FIG. 3B shows a plot of access line voltages versus time of the typical prior art program operation of FIG. 3A

FIG. 3B shows a plot of access line voltages $V_{WL}$ versus time of the typical prior art program operation of FIG. 3A, comparing voltages applied to an access line other than the selected access line (e.g., an unselected access line) with the selected access line. The unselected access line might be any access line coupled to a memory cell of a string of memory cells that has a memory cell coupled to the selected access line. For example, with reference to FIG. 2, if the selected access line represented word line $202_{x+2}$, the unselected access line might represent any of word lines $202_0$ to $202_{x+1}$ and any of word lines $202_{x+3}$ to $202_N$.

As shown in FIG. 3B, inhibit pulses 357 might be applied to an unselected access line while programming pulses 351 are being applied to the selected access line. The inhibit pulses 357 applied to an unselected access line might remain at the same voltage level even when programming pulses 351 increase by the step voltage 355. The inhibit pulses 357 might also be applied to the unselected access line at a time prior to applying the corresponding programming pulses 351 to the selected access line. The inhibit pulses 357 might be chosen to activate memory cells coupled to the unselected access line and to inhibit them from programming while the programming pulses 351 are applied to the selected access line.

While the verify pulses 353 are being applied to the selected access line, pass voltage pulses 359 might be applied to the unselected access line to activate memory cells coupled to the unselected access line so that the selected memory cell can control whether current is passed through its string of memory cells (e.g., NAND string). In this manner, current flow might be allowed through the string of memory cells if the selected memory cell is activated in response to the verify pulse 353, and current flow might be restricted if the selected memory cell is deactivated in response to the verify pulse 353.

Figure 4A:
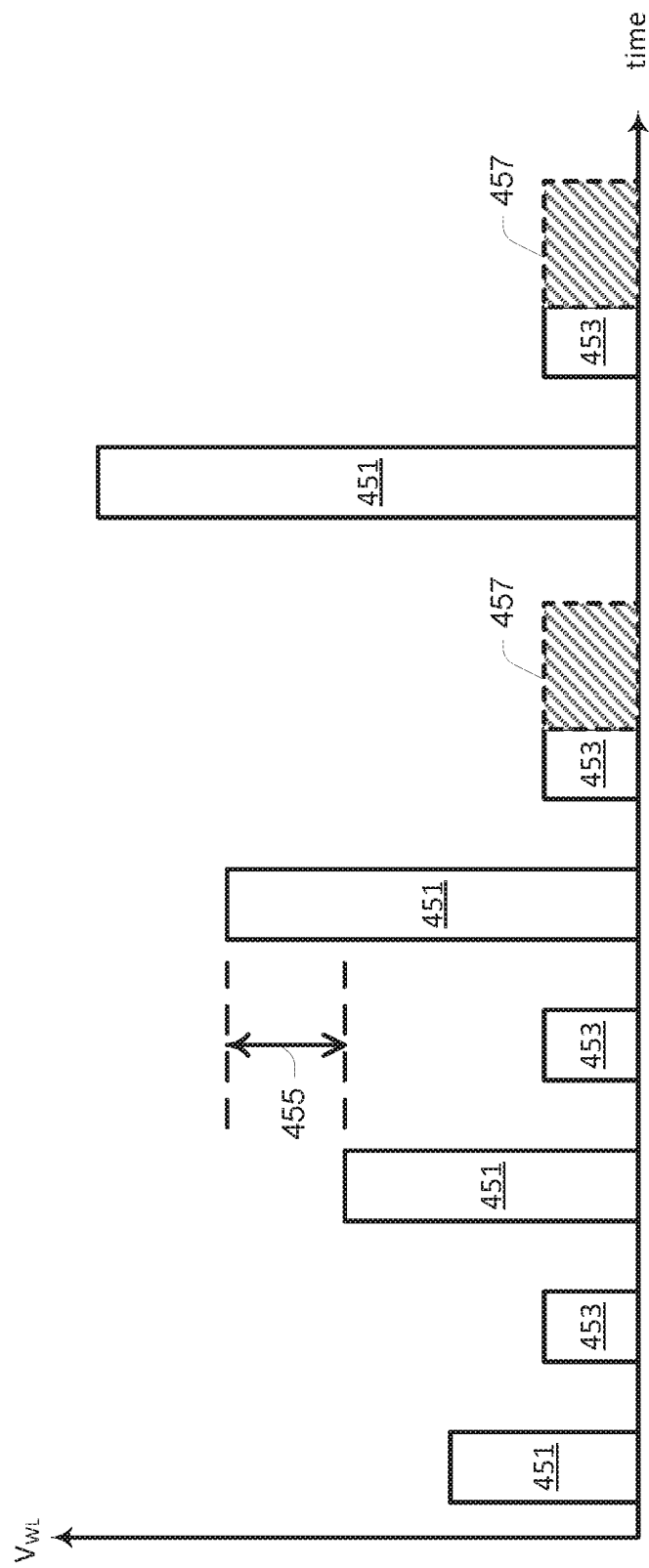
FIG. 4A shows a plot of an access line voltage versus time of a program operation in accordance with an embodiment.

FIG. 4A shows a plot of an access line voltage $V_{WL}$ versus time of a program operation in accordance with an embodiment. The figure shows a series of incrementally increasing programming pulses 451 that might be applied to an access line (e.g., selected access line) coupled to a control gate of a memory cell selected for programming. The programming pulses 451 might increase a charge level on a floating gate of the selected memory cell, thereby increasing the cell's threshold voltage Vt. Each subsequent programming pulse 451 might be higher than a previous programming pulse 451 by some step voltage 455.

While increasing programming pulses are generally used to increase threshold voltages of selected memory cells during a program operation, there is no requirement that each subsequent pulse increase by some constant step voltage. For example, it is known to apply a set of programming pulses at a constant voltage, then to apply a subsequent set of programming pulses at some higher voltage. It is also known to change a value of the step voltage after some decision point during the program operation. For example, after a particular number of programming pulses, or after a programming pulse reaches some voltage level, a different (e.g., lower or higher) step voltage might be used for one or more subsequent programming pulses. Other methods for increasing voltage levels of programming pulses might be used, and embodiments described herein do not require the use of any particular method.

After each programming pulse 451, a verify pulse 453 might be applied to the access line to determine if the selected memory cell's threshold voltage has increased to some level representative of a desired data state, e.g., a threshold voltage higher than or equal to a voltage level of the verify pulse 453. The determination that the selected memory cell's threshold voltage has increased to a level representative of the desired data state might be indicated by restricted current flow (e.g., no current flow) through the selected memory cell when the verify pulse 453 fails to activate the selected memory cell. This determination might involve sensing current flow of the string of memory cells containing the selected memory cell either directly or indirectly. Embodiments are not dependent upon a particular sensing mechanism.

After some point in the program operation, one or more leak checks 457 might be performed. Note that leak checks 457 in FIG. 4A do not represent voltages applied to the selected access line, but instead represent delays following application of a verify pulse 453 during which the selected access line may be checked for current leakage.

Figure 4B:
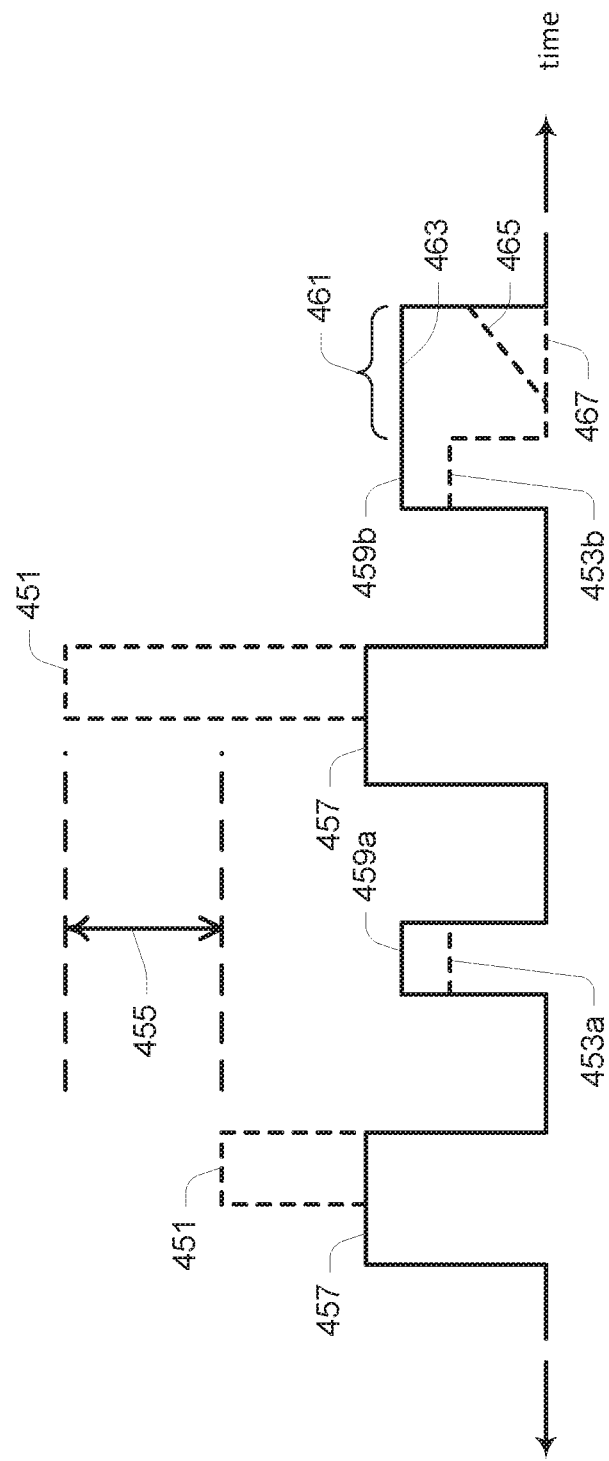
FIG. 4B shows a plot of access line voltages versus time of a program operation in accordance with an embodiment, such as the program operation of FIG. 4A.

FIG. 4B shows a plot of access line voltages $V_{WL}$ versus time of a program operation in accordance with an embodiment, such as the program operation of FIG. 4A, comparing voltages applied to an access line other than the selected access line (e.g., an unselected access line), with the selected access line. The unselected access line might include an access line immediately adjacent the selected access line. For example, with reference to FIG. 2, if the selected access line represented word line $202_{x+2}$, the unselected access line might represent any of word lines $202_0$ to $202_{x+1}$ and any of word lines $202_{x+3}$ to $202_N$.

As shown in FIG. 4B, inhibit pulses 457 might be applied to an unselected access line while programming pulses 451 are being applied to the selected access line. The inhibit pulses 457 applied to an unselected access line might remain at the same voltage level even when programming pulses 451 increase by the step voltage 455. The inhibit pulses 457 might also be applied to the unselected access line at a time prior to applying the corresponding programming pulses 451 to the selected access line. The inhibit pulses 457 might be chosen to activate memory cells coupled to the unselected access line and to inhibit them from programming while the programming pulses 451 are applied to the selected access line. Embodiments are not dependent upon a particular voltage level or timing of inhibit pulses 457.

While the verify pulses 453 (e.g., verify pulses 453a and 453b depicted in FIG. 4B) are being applied to the selected access line, pass voltage pulses 459 (e.g., pass voltage pulses 459a and 459b depicted in FIG. 4B) might be applied to the unselected access line to activate memory cells coupled to the unselected access line so that the selected memory cell can control whether current is passed through its string of memory cells (e.g., NAND string), e.g., allowing current flow if the selected memory cell is activated in response to the verify pulse 453, and restricting current flow if the selected memory cell is deactivated in response to the verify pulse 453. Following verify pulse 453b, the selected access line may be electrically floating. For example, following verify pulse 453b, the selected access line might be brought to some resting voltage (e.g., a ground potential) and then isolated from intentional voltage sources.

While verify pulses 453a and 453b might be the same length, and pass voltage pulse 459a might be the same length as its corresponding verify pulse 453a, pass voltage pulse 459b may extend for a time period 461 beyond its corresponding verify pulse 453b. The time period 461 may correspond to a time period of a leak check 457. Although depicted as an extended pass voltage pulse 459b, the portion of pass voltage pulse 459b during time period 461 might be thought of as a leak check pulse 463. The voltage differential between the voltage level of the leak check pulse 463 and the voltage level of the selected access line may cause current to flow between one or more unselected access lines and the selected access line if the selected access line is either shorted to one or more of the unselected access lines (e.g., one or both unselected access lines immediately adjacent the selected access line), or the selected access line is otherwise not sufficiently isolated from one or more of the unselected access lines. Such current flow can cause a change in voltage level, e.g., higher or lower depending upon the direction of the differential, of a floating selected access line from its resting voltage. During time period 461, assuming the voltage level of the leak check pulse 463 is higher than the voltage level of the selected access line, the leak check 457 might indicate a failure condition (e.g., an electrical short or other current leakage path) of the selected access line if the voltage level of the selected access line increases, such as shown at 465, and might indicate a passing condition if the voltage level of the selected access line remains low, such as shown at 467. It will be understood that if the voltage level of the leak check pulse 463 is lower than the voltage level of the selected access line, the leak check 457 might indicate a failure condition of the selected access line if the voltage level of the selected access line decreases.

Figure 4C:
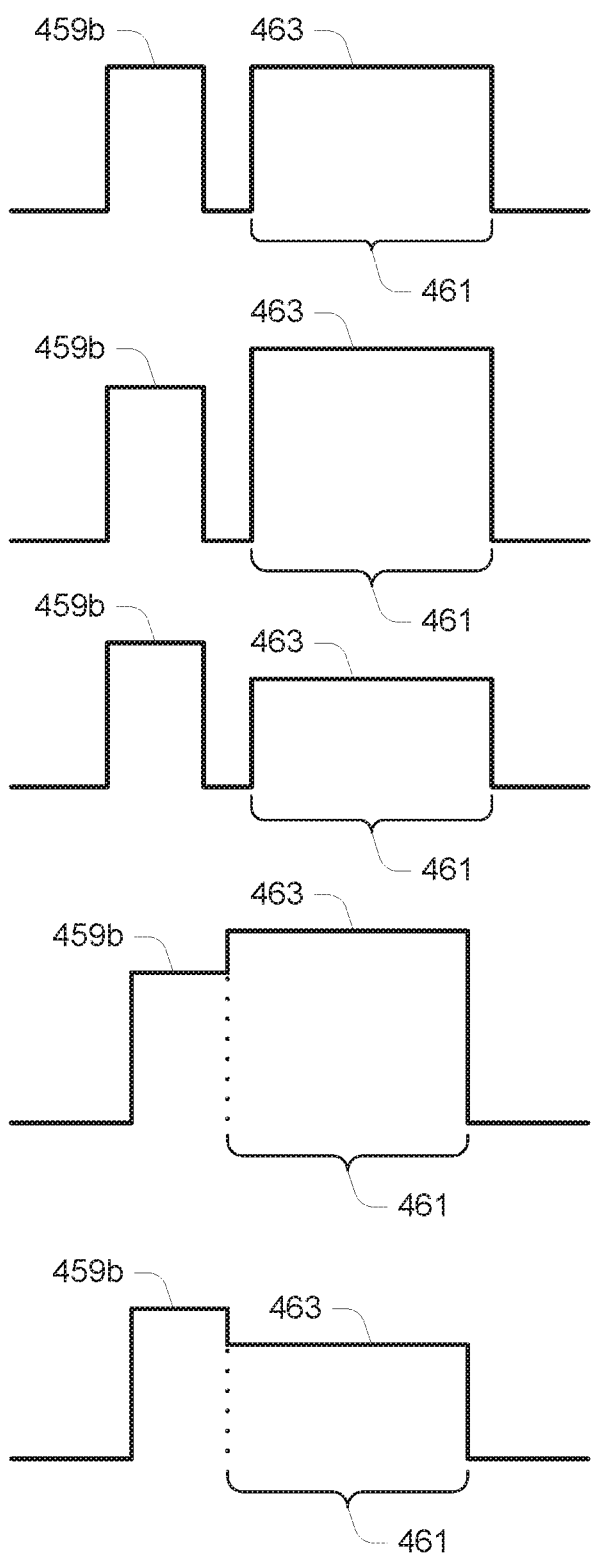
FIG. 4C depicts examples of a pass voltage pulse and a leak check pulse having different voltage levels as well as being separate or conjoined pulses in accordance with various embodiments.

Although FIG. 4B depicts pass voltage pulse 459*b* and leak check pulse 463 to be a single, conjoined pulse having the same voltage level, the leak check pulse 463 could be at a higher or lower voltage level from pass voltage pulse 459*b*. In addition, the pass voltage pulse 459*b* and leak check pulse 463 might be separate pulses rather than conjoined pulses. FIG. 4C depicts examples of a pass voltage pulse 459*b* and a leak check pulse 463 having different voltage levels as well as being separate or conjoined pulses in accordance with various embodiments. As depicted in FIG. 4C, for embodiments having separate pulses, the leak check pulse 463 may be immediately subsequent to the pass voltage pulse 459*b*.

Figure 5A:
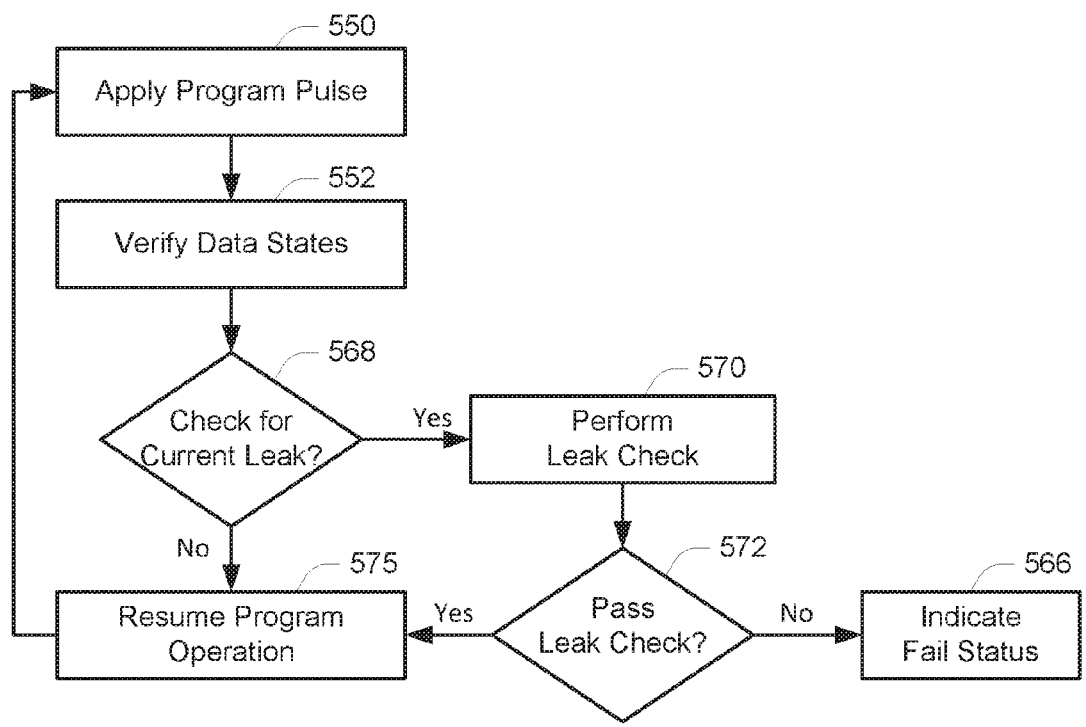
FIG. 5A is a flowchart of a method of operating a memory according to an embodiment.

FIG. 5A is a flowchart of a method of operating a memory according to an embodiment. For example, FIG. 5A may represent a portion of a program operation. Note that the flowchart of FIG. 5A may not represent all steps of the program operation, and that a program operation in accordance with embodiments described herein may include additional and/or alternative steps.

At 550, a program pulse might be applied, such as to a selected access line coupled to one or more memory cells selected for programming. Data states are verified at 552, such as to determine whether the selected memory cells have reached threshold voltages representative of their respective desired data states. For example, for memory arrays arranged in strings of serially-connected memory cells, the selected memory cells might be sensed while a verify pulse might be applied to the selected access line and while pass voltage pulses are applied to unselected access lines coupled to other memory cells of the strings of memory cells containing the selected memory cells. If a selected memory cell remains deactivated in response to the verify pulse, it may be deemed to successfully verify, while if a selected memory cell is activated in response to the verify pulse, it may be deemed to fail the verify.

At 568, a decision might be made whether to check for a current leak, e.g., for the selected access line. The decision might be made in response to a count of a number of program pulses that have been applied in the program operation reaching some particular number of program pulses. The decision might be made in response to a voltage level of the prior program pulse reaching some particular voltage level. The decision might be made in response to a number of the selected memory cells to verify successfully reaching some particular number of selected memory cells. In addition, the decision might be made in response to more than one factor. For example, it might be decided to check for a current leak if the prior program pulse reaches a particular voltage level or if the number of the selected memory cells to verify successfully reaches some particular number of selected memory cells, whichever occurs first. Furthermore, it may be decided to check for a current leak more than once during a program operation. For example, it might be decided to check for a current leak if the prior program pulse reaches a first particular voltage level, and to check for a current leak again if the prior program pulse reaches a second particular voltage level different (e.g., higher) than the first particular voltage level, or it might be decided to check for a current leak when the prior program pulse reaches a particular voltage level and when the number of the selected memory cells to verify successfully reaches some particular number of selected memory cells.

If the decision at 568 is to check for a current leak, a leak check might be performed at 570. The leak check will be described in more detail with reference to FIG. 5C. At 572, a determination might be made whether the leak check was deemed to pass or fail. If the leak check is deemed to fail, a fail status for the program operation might be indicated at 566. If the leak check is deemed to pass, the program operation might be resumed at 575, and a subsequent program pulse might be applied at 550.

Figure 5B:
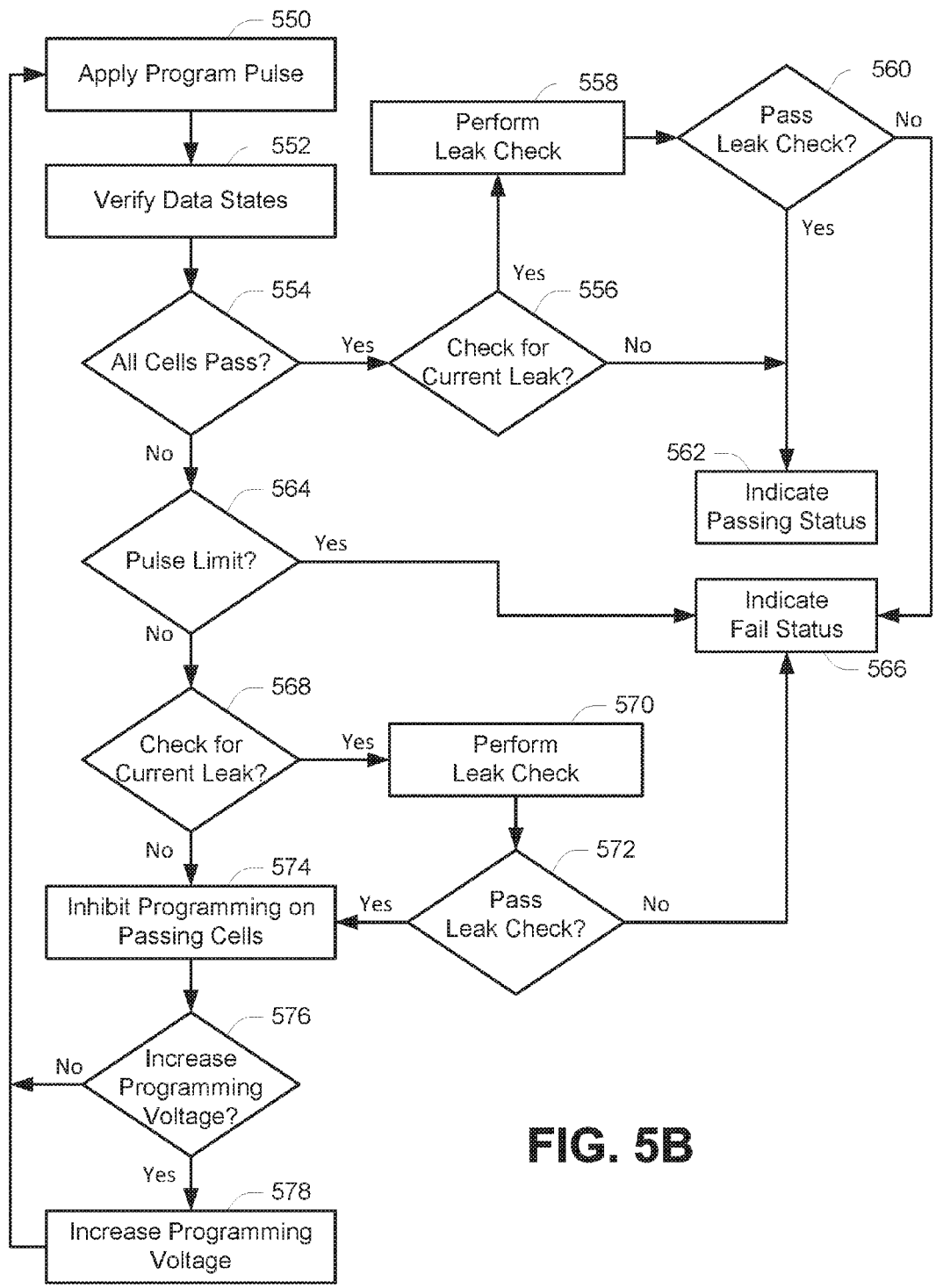
FIG. 5B is a flowchart of a method of operating a memory according to another embodiment.

FIG. 5B is a flowchart of a method of operating a memory according to another embodiment. For example, FIG. 5B may represent a portion of a program operation. Although the flowchart of FIG. 5B may represent a program operation in more detail than the flowchart of FIG. 5A, the flowchart of FIG. 5B may not represent all steps of the program operation, and a program operation in accordance with embodiments described herein may include additional and/or alternative steps.

At 550, a program pulse might be applied, such as to a selected access line coupled to one or more memory cells selected for programming. Data states are verified at 552, such as to determine whether the selected memory cells have reached threshold voltages representative of their respective desired data states. For example, for memory arrays arranged in strings of serially-connected memory cells, the selected memory cells might be sensed while a verify pulse might be applied to the selected access line and while pass voltage pulses are applied to unselected access lines coupled to other memory cells of the strings of memory cells containing the selected memory cells. If a selected memory cell remains deactivated in response to the verify pulse, it may be deemed to successfully verify, while if a selected memory cell is activated in response to the verify pulse, it may be deemed to fail the verify.

At 554, a determination might be made whether all selected memory cells successfully verified. If they did, a decision might be made at 556 whether to check for a current leak, e.g., for the selected access line. The decision might be made using criteria as discussed with reference to FIG. 5A at 568. If the decision at 556 is to not check for a current leak, a passing status for the program operation might be indicated at 562, and the program operation might be deemed complete. If the decision at 556 is to check for a current leak, a leak check may be performed at 558. The leak check will be described in more detail with reference to FIG. 5C. At 560, a determination might be made whether the leak check was deemed to pass or fail. If the leak check is deemed to fail, a fail status for the program operation may be indicated at 566. If the leak check is deemed to pass, a passing status for the program operation might be indicated at 562, and the program operation might be deemed complete.

If the determination at 554 finds that not all selected memory cells successfully verified, i.e., some selected memory cells have not yet reached a threshold voltage indicative of their desired data state, a determination might be made at 564 whether a pulse limit has been reached. For example, it may be desired to deem a program operation failed if it takes too many program pulses to reach the desired data states for all selected memory cells. As such, if a pulse limit is exceeded (e.g., a number of program pulses applied in the program operation exceeds a particular number), a fail status for the program operation may be indicated at 566. If the pulse limit is not exceeded, a decision might be made at 568 whether to check for a current leak, e.g., for the selected access line. The decision might be made using criteria as discussed with reference to FIG. 5A at 568.

If the decision at 568 is to check for a current leak, a leak check might be performed at 570. The leak check will be described in more detail with reference to FIG. 5C. At 572, a determination might be made whether the leak check was deemed to pass or fail. If the leak check is deemed to fail, a fail status for the program operation might be indicated at 566. If the leak check is deemed to pass, programming of selected memory cells that have successfully verified might be inhibited at 574. A decision might be made at 576 whether to increase the programming voltage for a subsequent program pulse. If the decision at 576 is to not increase the programming voltage, the program operation can resume and might apply a subsequent program pulse at 550 at the same programming voltage. If the decision at 576 is to increase the programming voltage, the programming voltage might be increased at 578, and the program operation can resume and might apply a subsequent program pulse at 550 at the higher programming voltage.

Figure 5C:
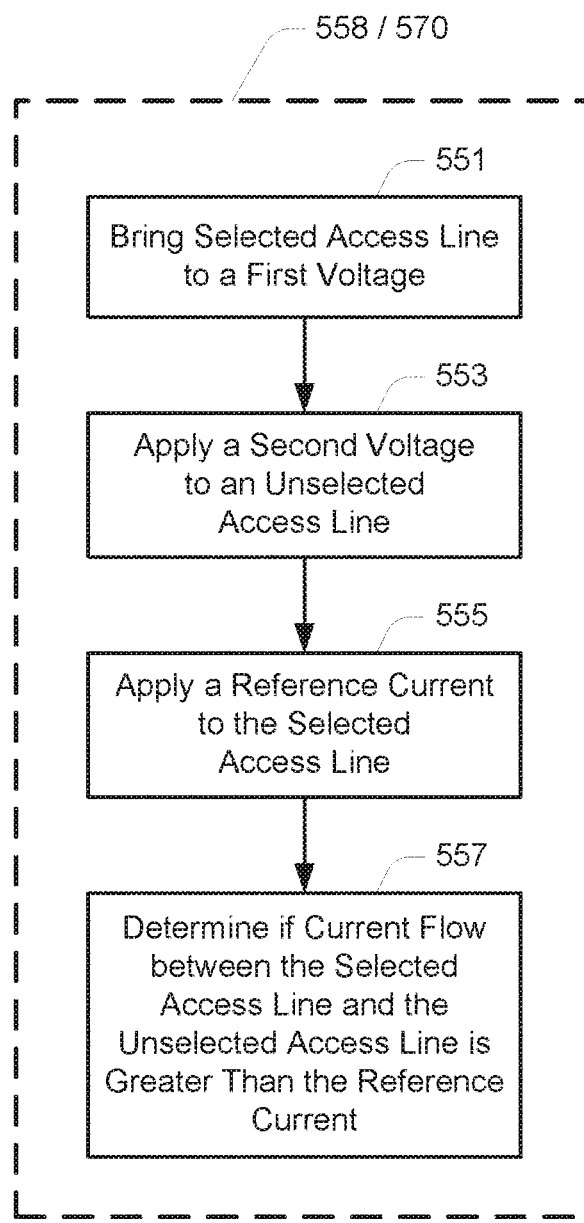
FIG. 5C is a flowchart of a method of performing a leak check according to an embodiment.

FIG. 5C is a flowchart of a method of performing a leak check according to an embodiment, such as at 558 in FIG. 5A or at 558 and 570 of FIG. 5B. For the leak check, at 551, the selected access line is brought to a first voltage. For example, a reference voltage (e.g., a ground potential) might be applied to the selected access line. For other embodiments, the first voltage might be less than a ground potential or greater than a ground potential. The selected access line might be electrically floated (e.g., isolated from voltage sources) after being brought to the first voltage.

At 553, a second voltage, different from the first voltage, might be applied to an unselected access line. For example, the second voltage might be applied to one or both of the unselected access lines immediately adjacent the selected access line. For some embodiments, the second voltage is higher than the first voltage. For other embodiments, the second voltage is lower than the first voltage.

At 555, a reference current might be applied to the selected access line. The reference current might be chosen to represent what is deemed to be an acceptable level of current leakage for the voltage differential between the selected access line and the unselected access line. For embodiments where the second voltage is higher than the first voltage, the reference current might be a current sink, while for embodiments where the second voltage is lower than the first voltage, the reference current might be a current source.

At 557, it might be determined if current flow between the selected access line and the unselected access line is greater than the reference current. For example, a voltage level of the selected access line could be monitored to determine if a change of voltage level from the first voltage is indicative of excessive current flow. For embodiments where the second voltage is higher than the first voltage, the voltage level of the selected access line might increase if the current flow to the selected access line is greater than the reference current being sinked from the selected access line. Similarly, for such embodiments, a voltage level of the selected access line remaining the same or decreasing might indicate that the current flow to the selected access line does not exceed (e.g., is less than or equal to) the reference current being sinked from the selected access line. For embodiments where the second voltage is lower than the first voltage, the voltage level of the selected access line might decrease if the current flow from the selected access line is greater than the reference current being sourced to the selected access line. Similarly, for such embodiments, a voltage level of the selected access line remaining the same or increasing might indicate that the current flow from the selected access line does not exceed (e.g., is less than or equal to) the reference current being source to the selected access line.

Figure 6A:
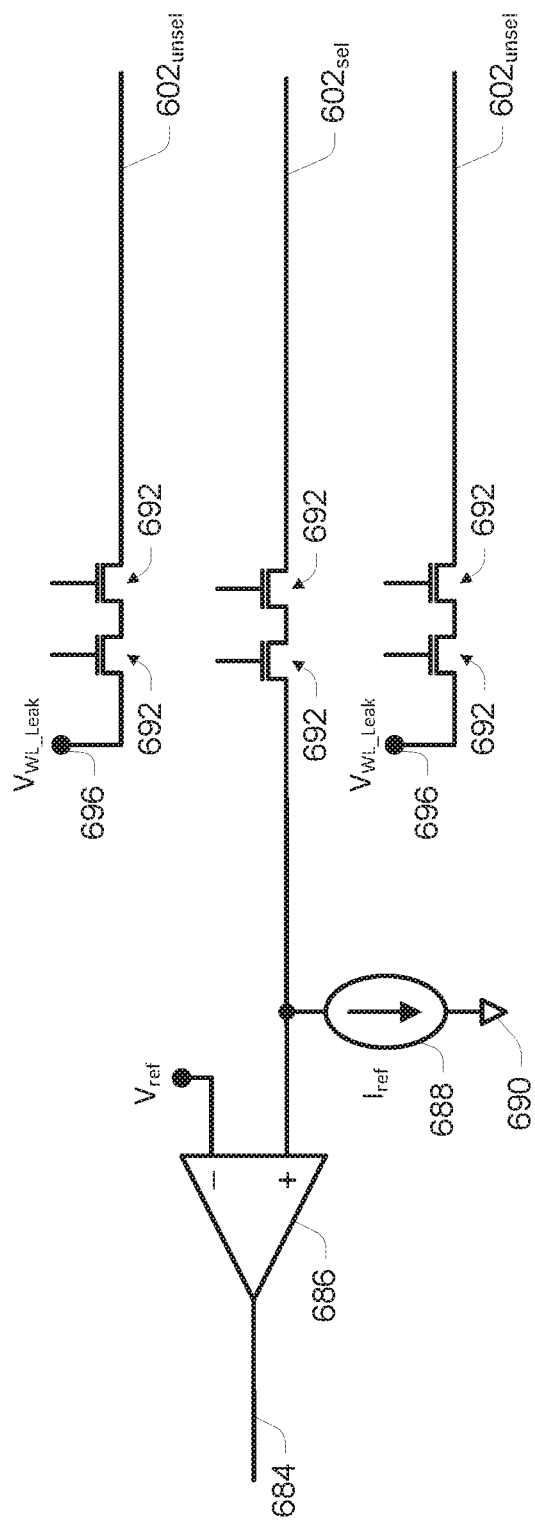
FIG. 6A is a simplified schematic of circuitry for determining whether current flow between a selected access line and an unselected access line exceeds a reference current in accordance with an embodiment.

FIG. 6A is a simplified schematic of circuitry for determining whether current flow between a selected access line and an unselected access line exceeds a reference current in accordance with an embodiment. An operational amplifier (op-amp) 686 might have an output 684 for providing a signal indicative of whether current flow between a selected access line and an unselected access line exceeds a reference current. A first input (e.g., a non-inverted input) of the op-amp 686 might be connected to receive a voltage from a selected access line 602sel. The op-amp 686 might be located opposite from high-voltage transistors 692 that are often located between access line drivers (not shown in FIG. 6A) and the memory array to which the access lines 602 are connected.

The first input of the op-amp 686 might be further connected to a reference current source 688, which might be coupled to a potential node (e.g., reference or ground potential node) 690. The reference current source 688 may be configured to sink a current (e.g. the reference current Iref) substantially equal to (e.g., equal to) a level of current flow that is deemed acceptable for a particular voltage difference between the selected access line 602sel and one or more unselected access lines 602unsel. For some embodiments, e.g., when determining whether current leakage from the selected access line 602sel and one or more unselected access lines 602unsel, the reference current source 688 might be configured to source a current (e.g., the reference current Iref) substantially equal to (e.g., equal to) a level of current flow that is deemed acceptable for a particular voltage difference between the selected access line 602sel and one or more unselected access lines 602unsel. The unselected access lines 602unsel might be adjacent (e.g., immediately adjacent) the selected access line 602sel.

A second input (e.g., an inverted input) of the op-amp 686 might be connected to receive a reference voltage, Vref. In general, the reference voltage Vref might be substantially equal to (e.g., equal to) a voltage level (e.g., the resting voltage) that may be applied to the selected access line 602sel prior to performing a leak check. For example, following a verify pulse 459b, the reference voltage Vref might be applied to the selected access line 602sel. The selected access line 602sel might then be permitted to electrically float prior to applying the reference current Iref.

The reference current Iref might be applied to the selected access line 602sel at a time (e.g., time period 461 of FIG. 4B) when a voltage other than the reference voltage Vref is applied to one or more unselected access lines 602unsel. For example, a second voltage (e.g., $V_{WL\_leak}$) that is different than (e.g., higher than or lower than) the resting voltage (e.g., the reference voltage Vref) of the selected access line 602sel, might be applied to an unselected access line 602unsel through a potential node 696. Where the second voltage is higher than the resting voltage, current might be expected to flow from an unselected access line 602unsel to the selected access line 602sel if there is a leakage path between that unselected access line 602unsel and the selected access line 602sel. If that current flow is equal to or greater than the reference current Iref, the voltage level of the selected access line 602sel might be expected to remain at a level of the reference voltage Vref or increase to a level above the reference voltage Vref such that the output 684 of the op-amp 686 might have a logic 1 value to indicate a fail status. Similarly, if that current flow is less than the reference current Iref, the voltage level of the selected access line 602sel might be expected to decrease to a level below the reference voltage Vref such that the output 684 of the op-amp 686 might have a logic 0 value to indicate a passing status. It will be apparent that for embodiments where the second voltage (e.g., $V_{WL\_leak}$) of the unselected access line 602unsel is lower than the resting voltage (e.g., the reference voltage Vref) of the selected access line 602sel, and the reference current source 688 is configured to source the reference current Iref to the selected access line 602sel, a fail status might be indicated by a logic 0 value of the output 684 of the op-amp 686 and a passing status might be indicated by a logic 1 value of the output 684 of the op-amp 686.

Figure 6B:
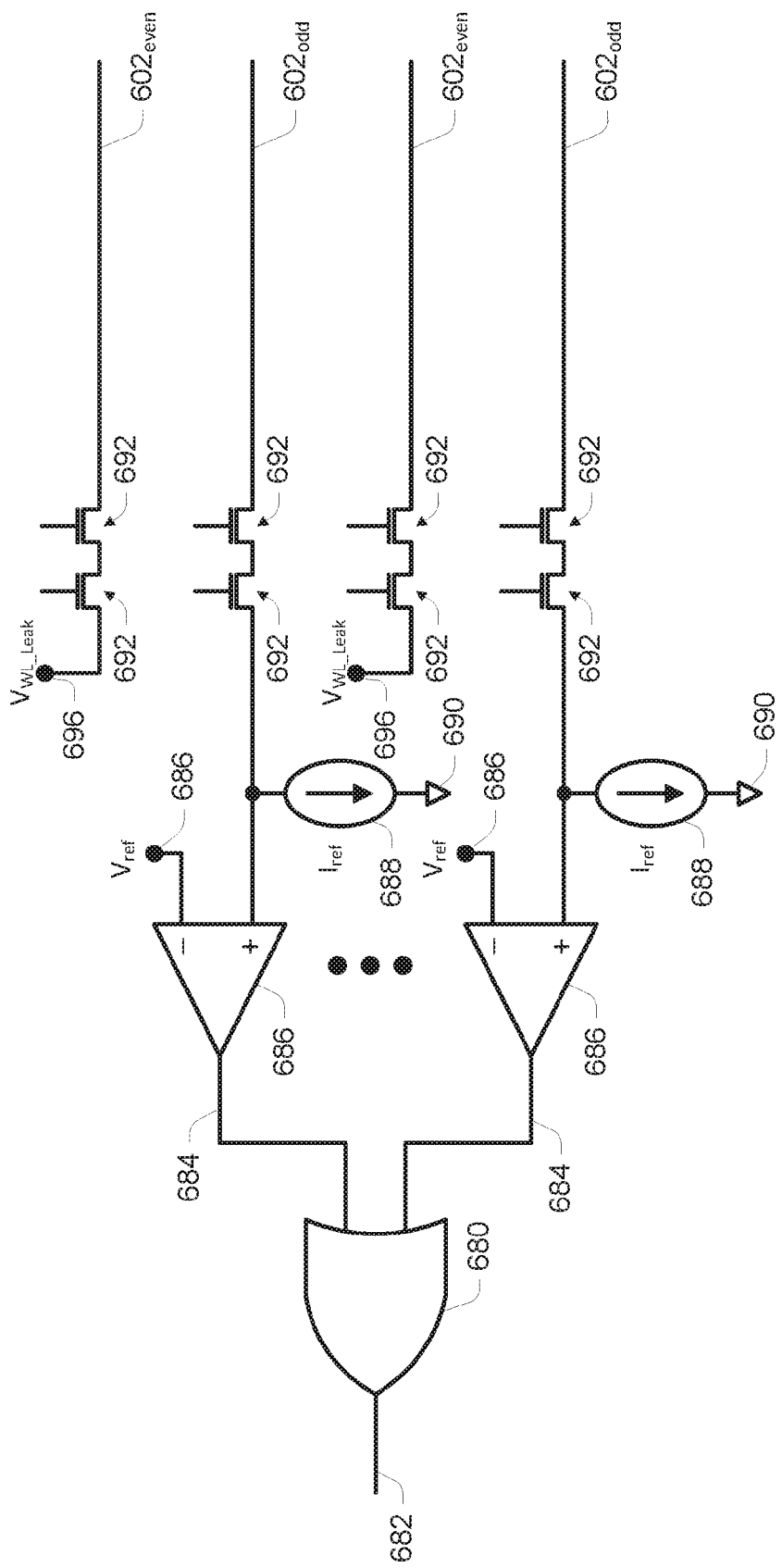
FIG. 6B is a simplified schematic of circuitry for determining whether current flow between a selected access line and an unselected access line exceeds a reference current in accordance with another embodiment.

FIG. 6B is a simplified schematic of circuitry for determining whether current flow between a selected access line and an unselected access line exceeds a reference current in accordance with another embodiment. For the embodiment depicted in FIG. 6B, more than one selected access line 602 might be checked for current leakage. For example, for one leak check, every other access line (e.g., odd access lines 602odd) might be selected access lines and every other access line (e.g., even access lines 602even) might be unselected access lines. A similar configuration could be provided such that for another leak check, every other access line (e.g., even access lines 602even) might be selected access lines and every other access line (e.g., odd access lines 602odd) might be unselected access lines. The operation of the circuitry of FIG. 6B is similar to the operation of the circuitry of FIG. 6A, but the outputs 684 of multiple op-amps 686 might be provided as inputs to a logic gate (e.g., OR gate) 680. When a fail status is indicated by a logic 1 value of any op-amp 686, the output 682 of the OR gate 680 would indicate a fail status if any selected access line 602odd experienced current leakage exceeding the reference current Iref. When a fail status is indicated by a logic 0 value of any op-amp 686, the logic gate 680 might instead be an AND gate such that a fail status would be indicated if any selected access line 602odd experienced current leakage exceeding the reference current Iref.

FIG. 6C is a voltage trace of a voltage level of a selected access line for various conditions during a leak check according to various embodiments. For example, at time t0, the reference voltage Vref is applied to the selected access line. Some time after the selected access line reaches a voltage level of the reference voltage Vref (e.g., between times t1 and t2 inclusive), the reference voltage Vref might be removed and the selected access line might be allowed to electrically float. At time t2, the second voltage (e.g., $V_{WL\_leak}$) might be applied to one or more unselected access lines (e.g., one or both access lines adjacent the selected access line) while the reference current Iref is applied to the selected access line. For embodiments where the second voltage is higher than the reference voltage Vref, and the reference current Iref sinks current from the selected access line, a fail status might be indicated if the voltage level of the selected access line follows trace 683, while traces 685 and 687 might indicate a passing status. For embodiments where the second voltage is lower than the reference voltage Vref, and the reference current Iref sources current to the selected access line, a fail status might be indicated if the voltage level of the selected access line follows trace 687, while traces 683 and 685 might indicate a passing status.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory device, comprising:
applying a program pulse to a selected access line coupled to a memory cell selected for programming during a program operation;
applying a verify pulse to the selected access line to activate the memory cell selected for programming if it has reached a desired data state while applying a pass voltage pulse to an unselected access line adjacent the selected access line to activate a memory cell coupled to the unselected access line regardless of its data state;
after applying the pass voltage pulse to the unselected access line, applying a particular voltage to the unselected access line;
while applying the particular voltage to the unselected access line, sensing a current of the selected access line; and
indicating a fail status of the program operation, regardless of whether the memory cell selected for programming has reached the desired data state, if an absolute value of the sensed current of the selected access line is greater than a particular current.

2. The method of claim 1, further comprising sensing a current of a third access line adjacent the unselected access line while applying the particular voltage to the unselected access line, and indicating the fail status of the program operation if an absolute value of the sensed current of the third access line is greater than the particular current.

3. The method of claim 2, further comprising indicating the fail status for the program operation if the absolute value of the sensed current of either the selected access line or the third access line is greater than the particular current.

4. The method of claim 3, further comprising applying a subsequent program pulse to the selected access line if the fail status of the program operation is not indicated and the memory cell selected for programming has not reached the desired data state.

5. The method of claim 1, further comprising applying a subsequent program pulse to the selected access line if the fail status of the program operation is not indicated and the memory cell selected for programming has not reached the desired data state.

6. The method of claim 5, further comprising applying the subsequent program pulse to the selected access line only if the fail status of the program operation is not indicated and at least one memory cell coupled to the selected access line and selected for programming has not reached the desired data state.

7. The method of claim 1, wherein sensing the current of the selected access line comprises applying a reference current to the selected access line having an absolute value equal to the particular current.

8. The method of claim 7, wherein applying the reference current to the selected access line comprises sourcing the reference current to the selected access line if a voltage of the selected access line is greater than the particular voltage, and sinking the reference current from the selected access line if a voltage of the selected access line is less than the particular voltage.

9. The method of claim 7, wherein sensing the current of the selected access line comprises connecting the selected access line to one input of a differential amplifier while applying the reference current to the selected access line.

10. The method of claim 9, further comprising:
bringing the selected access line to a reference voltage before applying the reference current to the selected access line; and
applying the reference voltage to a second input of the differential amplifier while applying the reference current to the selected access line.

11. The method of claim 1, wherein applying the particular voltage to the unselected access line comprises applying a voltage pulse subsequent to and conjoined with the pass voltage pulse.

12. The method of claim 1, wherein applying the particular voltage to the unselected access line comprises applying a voltage pulse having a same voltage level as the pass voltage pulse.

13. A method of operating a memory device, comprising:
applying a program pulse to a selected access line coupled to a memory cell selected for programming during a program operation;
applying a verify pulse to the selected access line to activate the memory cell selected for programming if it has reached a desired data state while applying a pass voltage pulse to an unselected access line adjacent the selected access line to activate a memory cell coupled to the unselected access line regardless of its data state;
bringing the selected access line to a reference voltage;
while the selected access line is at the reference voltage, configuring the selected access line to electrically float;
applying a particular voltage to the unselected access line;
after configuring the selected access line to electrically float, applying a reference current to the selected access line while applying the particular voltage to the unselected access line;
while applying the particular voltage to the unselected access line and applying the reference current to the selected access line, sensing a current of the selected access line; and
indicating a fail status of the program operation, regardless of whether the memory cell selected for programming has reached the desired data state, if an absolute value of the sensed current of the selected access line is greater than an absolute value of the reference current.

14. The method of claim 13, wherein applying the particular voltage to the unselected access line comprises applying a voltage higher than the reference voltage, and wherein applying the reference current to the selected access line comprises sinking the reference current from the selected access line.

15. The method of claim 13, wherein applying the particular voltage to the unselected access line comprises applying a voltage lower than the reference voltage, and wherein applying the reference current to the selected access line comprises sourcing the reference current to the selected access line.

16. The method of claim 13, further comprising applying a subsequent program pulse to the selected access line if the fail status of the program operation is not indicated and the memory cell selected for programming has not reached the desired data state.

17. The method of claim 16, wherein applying the subsequent program pulse to the selected access line comprises applying the subsequent program pulse at a voltage level higher than the prior program pulse.

18. A method of operating a memory device, comprising:
applying a program pulse to a selected access line coupled to a memory cell selected for programming during a program operation;
applying a verify pulse to the selected access line to activate the memory cell selected for programming if it has reached a desired data state while applying a pass voltage pulse to a second access line adjacent the selected access line to activate a memory cell coupled to the second access line regardless of its data state and while applying the pass voltage pulse to a third access line adjacent the selected access line to activate a memory cell coupled to the third access line regardless of its data state, wherein the second access line and the third access line are coupled to memory cells not selected for programming during the program operation;
bringing the selected access line to a reference voltage;
while the selected access line is at the reference voltage, configuring the selected access line to electrically float;
applying a particular voltage to the second access line and to the third access line;
after configuring the selected access line to electrically float, applying a reference current to the selected access line while applying the particular voltage to the second access line and to the third access line;
while applying the particular voltage to the second access line and to the third access line, and while applying the reference current to the selected access line, sensing a current of the selected access line; and
indicating a fail status of the program operation, regardless of whether the memory cell selected for programming has reached the desired data state, if an absolute value of the sensed current of the selected access line is greater than an absolute value of the reference current.

19. The method of claim 18, further comprising sensing a current of a fourth access line adjacent the second access line while applying the particular voltage to the second access line, and indicating the fail status of the program operation if an absolute value of the sensed current of the fourth access line is greater than the absolute value of the reference current.

20. The method of claim 19, further comprising applying a subsequent program pulse to the selected access line if the fail status of the program operation is not indicated and the memory cell selected for programming has not reached the desired data state.

* * * * *